United States Patent
Watts et al.

(10) Patent No.: US 6,408,260 B1
(45) Date of Patent: Jun. 18, 2002

(54) LASER LITHOGRAPHY QUALITY ALARM SYSTEM

(75) Inventors: Michael P. C. Watts, Portola Valley; Tom A. Watson, Carlsbad, both of CA (US)

(73) Assignee: Cymer, Inc., San Diego, CA (US)

(*) Notice: Subject to any disclaimer, the term of this patent is extended or adjusted under 35 U.S.C. 154(b) by 0 days.

(21) Appl. No.: 09/505,233

(22) Filed: Feb. 16, 2000

(51) Int. Cl.[7] .............................. G06F 15/00; H01S 3/00
(52) U.S. Cl. ........................ 702/188; 702/179; 372/20; 372/57
(58) Field of Search ................................ 702/179, 180, 702/182, 185, 188; 372/20, 50, 55–57, 100, 103

(56) References Cited

U.S. PATENT DOCUMENTS

| | | | |
|---|---|---|---|
| 5,978,406 A | * 11/1999 | Rokni et al. | 372/57 |
| 5,982,800 A | * 11/1999 | Ishihara et al. | 372/20 |
| 5,991,324 A | * 11/1999 | Knowles et al. | 372/57 |
| 6,014,398 A | * 1/2000 | Hofmann et al. | 372/57 |
| 6,188,710 B1 | * 2/2001 | Besaucele et al. | 372/57 |

\* cited by examiner

*Primary Examiner*—Bryan Bui
(74) *Attorney, Agent, or Firm*—John R. Ross

(57) ABSTRACT

An electric discharge laser with an associated programmable controller which (1) will permit an operator to specify beam quality parameters based on historical data (2) will monitor those parameters and (3) will provide a notification signal to the operator informing him when the beam quality is adequate for integrated circuit fabrication. The controller is programmed to indicate an out-of-control condition when one or more quality parameters exhibit certain specified non-random behavior such as two out of three quality measurements deviating by more than 4 standard deviations and/or three out of four quality measurements deviating by more three standard deviations. In a preferred embodiment the program is designed to detect poor quality by looking for these "runs" of bad quantity data and to produce false indication of system out of control, on the average, no more than once each two months.

18 Claims, 1 Drawing Sheet

LASER LITHOGRAPHY QUALITY ALARM SYSTEM

The present invention relates to quality alarm systems and in particular to quality alarm systems for electric discharge lasers used for integrated circuit lithography.

BACKGROUND OF THE INVENTION

An important use of gas discharge ultraviolet lasers such as KrF excimer lasers is as light sources for integrated circuit fabrication. These lasers are typically used with lithography machines called stepper and scanner machines. Lithography lasers are typically operated in a "burst" mode in which a large number (e.g. 85) die sections of a wafer are illuminated one-at-a-time. A typical burst of laser pulses (such as about 400) at (for example) 10 mJ per pulse is delivered at a repetition rate of about 2000 pulses per second to illuminate a single die section in about 0.2 second. After a die section is illuminated the laser is idle for a very short period (such as about 0.3 second) while the lithography equipment positions the wafer and the lens equipment of the lithography machine to illuminate the next die section. This on-off process continues until all die sections on the wafer have been illuminated at which time the laser is idle for a few seconds (such as about 8 seconds) while a new wafer is loaded for processing. This cycle continues as a part of an integrated circuit fabrication line which operates 24 hours per day, 7 days per week. All equipment must be extremely reliable because any unscheduled downtime can cost many thousands of dollars in lost production. In addition, it is extremely important for high quality circuit fabrication that the quality of the laser beam from the laser light source be maintained within narrow quality limits.

What is needed is a laser having intelligent internal monitoring, and preselectable quality standards and a notification technique to alert laser users as to when the beam quality is adequate for production and when it is not.

SUMMARY OF THE INVENTION

The present invention provides an electric discharge laser with an associated programmable controller which (1) will permit an operator to specify beam quality parameters based on historical data (2) will monitor those parameters and (3) will provide a notification signal to the operator informing him when the beam quality is adequate for integrated circuit fabrication. The controller is programmed to indicate an out-of-control condition when one or more quality parameters exhibit certain specified non-random behavior such as two out of three quality measurements deviating by more than 4 standard deviations and/or three out of four quality measurements deviating by more three standard deviations. In a preferred embodiment the program is designed to detect poor quality by looking for these "runs" of bad quantity data and to produce false indication of system out of control, on the average, no more than once each two months.

DETAILED DESCRIPTION OF PREFERRED EMBODIMENTS

To Continue Or To Shutdown

Figure 1:
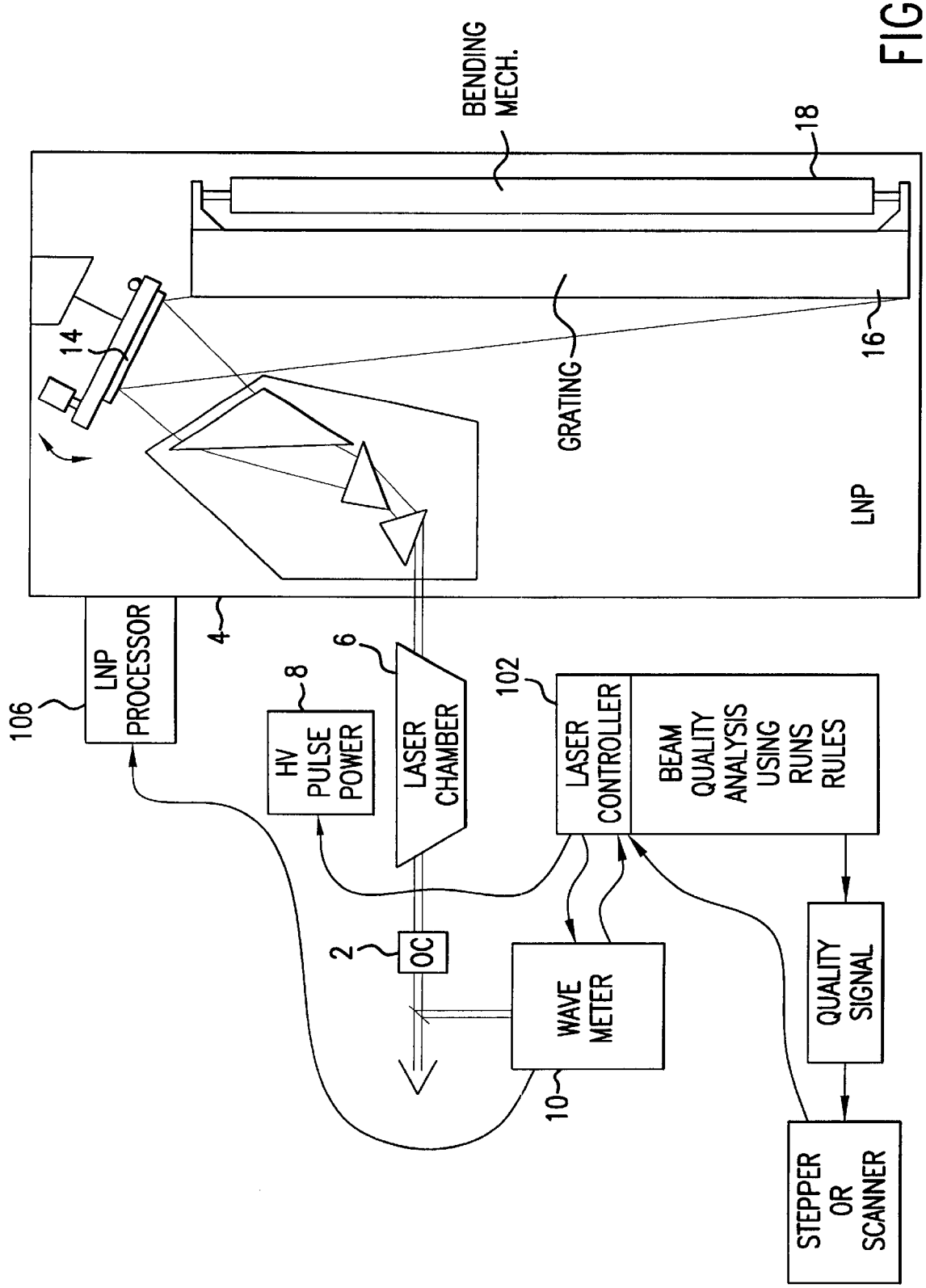
FIG. 1 depicts a preferred embodiment of the present invention.

An important issue in the production of integrated circuits is what the operator should do if the beam quality is not within specification. Should he continue to fabricate or shut down the unit and attempt to bring the beam quality back within specifications. To shut down results in loss of production. To continue operating could result in poor quality integrated circuits. Since rules of statistics apply to laser beam quality, natural variations will occasionally cause substantial deviation from desired quality ranges.

Because of the very high cost of a shut down, integrated circuit fabricators prefer that the integrated circuit lithography equipment be of such reliability that the mean time between shut downs (abbreviated as MTBF referring to "mean time between failure") be about 1500 hours at 50 percent duty factor.

The question is how does the operator determine that a "failure" has occurred? If a failure means beam quality that deviates from typical design specifications (which may represent a 1 sigma variation or may represent maximum average parameter deviation over a small number of events such as 30 pulses) statistical variations will result in failures much more often than once each 1500 hours. In fact, based on statistical principles quality limits would have to be set at about 6 sigma in order for natural variations to have a statistical chance of causing only one "false alarm" type failure in 1500 hours at a 50% duty factor.

The result is that the failure alarms requiring shutdown are typically set substantially higher than about 6 times the standard deviation of the quality beam parameters. The result is few alarms; however, in some cases out of control situations go undetected resulting in reduced quality of the integrated circuits.

The present invention applies to laser lithography, the concept of Runs Rules developed by Westinghouse Corporation to increase the sensitivity of quality control systems to relatively small variations in beam quality.

Active Control of Beam Quality

A lithography system showing features of the present invention is depicted in FIG. 1. Lasing occurs in a resonance cavity defined by output coupler 2 and line narrowing package (LNP) 4 (which is shown greatly expanded in this FIGURE). Amplification occurs in a gain medium produced by electric discharges in a KrF laser gas in laser chamber 6. The discharges are created by high voltage power supply 8 controlled by laser controller 102. This laser produces a pulse laser beam, typically at high pulse repetition rates such as 2000 pulses per second and about 10mJ per pulse.

Beam parameters are measured by very fast wavemeter 10 which is capable of monitoring each laser pulse at rates of 2000 Hz or greater and reporting the quantitative values of the following beam parameters:

centerline wavelength bandwidth pulse energy

Wavemeters of this general type are known in the prior art. A description of one such wavemeter is provided in U.S. Pat. No. 5,991,324 which is incorporated herein by reference.

The beam data from the wavemeter is analyzed by the laser controller and the pulse energy signal used in fast feedback arrangements to control pulse energy to desired target values by regulating a capacitor charging voltage at the front end of the high voltage power system.

The centerline wavelength value measured by the wavemeter is used in a feedback arrangement to control the beam wavelength by adjusting the pivot position of mirror 14 in LNP 4 in order to adjust the angle at which the laser beam is retro reflected from grating 16 back to the mirror through the prisms and back through the gain medium. (Prior art wavelength feedback control has required a period of a few milliseconds for wavelength correction, whereas pulse energy can be actively corrected in the time interval between pulses.) The bandwidth of the beam can be adjusted by changing the curvature of the active surface of grating 16 using bending mechanism 18. This bending is normally done manually only rarely but could be done in a feedback arrangement.

Reporting Beam Quality Information

The data from the wavemeter is also analyzed by laser controller 102 to monitor and report beam quality information. In a preferred embodiment the following beam quality parameters are calculated:

(1) Energy sigma ($\sigma_E$) defined as:

$$\sigma_E = \sqrt{\frac{\sum_{i=m}^{m+k}(E_i + E_T)^2}{k}} / E_T$$

where m is the first pulse of a k pulse rolling window (k being the number of pulses in the window) and $E_T$ is a target pulse energy such as 10 mJ.

(2) Energy Variation from Target ($E_V$) defined as:
$E_V$=maximum value of $E_i - E_T$ in a k-pulse window.

(3) Dose Variation ($D_V$) defined as:

$$D_V = \left(\frac{\sum_{i=m}^{m+k} E_i}{k} - D_T\right) / D_T$$

where $D_T$ is a target dose for a k size window.

(4) Wavelength Sigma ($\sigma_\lambda$) defined as:

$$\sigma_\lambda = \sqrt{\frac{\sum_{i=m}^{m+k}(\lambda_i - \lambda_T)^2}{k}}$$

(5) Wavelength Variation ($\lambda_V$) defined as:

$$\lambda_V = \frac{\sum_{i=m}^{m+k}\lambda_i - \lambda_T}{k}$$

(6) Bandwidth ($\Delta\lambda$) defined as pulse spectral width at one half maximum intensity (FWHM).

By tradition, the units of $\sigma_E$ and $D_V$ are expressed in percent. $E_V$ units are milliJoules, mJ. The units of $\sigma_\lambda$, $\Delta_\lambda$ and $\lambda_V$ are picometers, pm.

These values are stored temporarily in a memory buffer of the laser controller and can be read out to an external information processor or storage device or can be read by the stepper/scanner as desired.

In a preferred embodiment, the laser controller continuously analyzes the above quality parameters in order to determine if the laser is "out of control" using a variation of "Runs Rules" and criteria designed to provide MTBF of about 1500 hours (2 months).

| | |
|---|---|
| Wavelength variation (30 pulse window) = | ±0.07 pm |
| Wavelength sigma = | ±0.06 pm |
| Bandwidth = | 0.6 pm |
| Dose variation (30 pulse window) = | 0.4 percent |
| Energy Sigma (30 pulse window) = | 12 percent |
| Energy Variation (30 pulse window) = | 7.5 percent |

These specifications are examples of the type of quality standards which are applied to determine if a laser's performance passes an acceptance test prior to shipment from the laser fabrication plant.

Runs Rules

This Runs Rules technique is described in the Introduction to Statistical Quality Control, by Douglas Montgomery at pages 114 through 119. The concept is to try to develop a quality control technique which is sensitive to small but significant nonrandom variations in quality. These patterned deviations from target values are referred to as runs. They are an indication of quality control problems even though no single value varies enough to be determined as a "failure".

There are two special features described herein which distinguish the quality control techniques described herein from the prior art Westinghouse Runs Rule approach. The first feature is that the Westinghouse system uses a 3 sigma approach which would result in one false alarm for each 500 samples. An integrated circuit fabrication, 500 samples, are produced in a few minutes. For integrated circuit fabrication, what is needed is false alarm free operation for much longer periods such as about 1500 hours. This rate of false alarms (assuming duty cycles typically experienced in the industry) correlates to about 6 sigma or one false alarm out of one billion events.

The second unique feature relates to the choice of samples. Pulse data from excimer lasers are not normally distributed due to the fact that the burst mode operation produces patterns which are often rather well defined so that the pulse quality values are laser pulse not random about target or mean values, but varies systematically. It has been determined that using a worst case value for a series of measurements dominated by systematic variation is the best method of obtaining a randomly distributed measure of performance. Once there is randomly distributed measure then runs rules can be used. Conventional statistical process control teaches that for large subgroups of data (>10) using calculating standard deviations is the best method. It has been determined that using worst case value or range works best when dealing with large systematic variation. It has been determined that the worst case data for each burst data is typically normally distributed about target values. Therefore, the approach used herein is to utilize bursts of pulses as the sample for measuring beam quality.

The process for establishing alarm limits is as follows:
1) Collect sufficient beam quality data over the life of multiple lasers in order to determine natural variations in the data.
2) Determine a "worse value" of for each of several beam quality parameter (e.g., $\sigma_E$, $E_V$, $D_V$, $\lambda_V$ and $\sigma_\lambda$) for each burst and calculate the mean and standard deviation for the population of these worse values.
3) Set the limits for failure as follows:
   A) One event: mean plus 6σ
   B) Two out of three successive events: mean plus 4σ
   C) Three out of four successive events: mean plus 3σ

4) Monitor the beam quality parameters (e.g., $\sigma_E$, $E_V$, $D_V$, $\lambda_V$ and $\sigma_\lambda$) in comparison with the above limits, and provide an out of control signal upon the occurrence of any of the failure events.

Preferred Embodiments

In a first preferred embodiment of the present invention laser controls are set to indicate laser failure (or an out of control situation) if laser instrumentation indicates any of the measurements listed in columns 2, 3 or 4 of Table I. The beam quality values in columns 2, 3 and 4 were calculated based on actual historical data collected by Applicants from 1000 Hz and 2000 Hz state of the art lithography lasers. The values in the Table are consistent with the data collection techniques recommended in the following numbered paragraphs. (The reader should note that the limits set forth in Table I would need to be revised if the method of collecting operating data is changed from that recommended below. (For example, if the rolling window size were to be changed from 30 to a higher number such as 60, the limits in Table I for $\Delta_\lambda$, $\lambda_V$, $E_V$ and $\Delta_D$ would increase somewhat. The standard deviation values probably would not change. Also the values in the Table should be revised as the technology advances and beam quality improves. In fact the computer processor could be programmed to accumulate operational quality data and provide the equipment operator with updated values of standard deviation of the quality control data so that the operator can decide if the limits should be revised.

In order to provide notification to the integrated circuit fabricator. The following calculations are made by the laser controller:

(1) The laser is programmed to calculate the mean wavelength for each 30 consecutive pulses and to calculate the difference $\lambda_V$ between the mean wavelength and a target wavelength. The worst value of $\lambda_V$ for each burst is stored. An alarm signal is produced if one $\lambda_V$ is in excess of 0.16 pm, or if the worst value of $\lambda_V$ for 2 out of 3 consecutive bursts are in excess of 0.13 pm or if worst values of $\lambda_V$ are in excess of 0.08 pm for 3 out of 4 consecutive bursts.

(2) The standard deviations $\sigma_\lambda$ of each successive 30 pulses within each burst are calculated and the worst value of each burst is stored. An alarm signal is produced if a single value of the standard deviation $\sigma_\lambda$ is greater than 0.12 pm or, if the worst values of $\sigma_\lambda$ exceed 0.095 pm for 2 out of 3 consecutive bursts or if the worst values exceed 0.08 pm in 3 out of 4 consecutive bursts.

(3) The bandwidth of each pulse is calculated and the worst value in each burst is stored. An alarm signal is produced if one event is larger than 0.73 pm or if the worst values of bandwidths exceed 0.66 pm in 2 out of 3 consecutive bursts or if the worst value of bandwidth exceeds 0.60 pm in 3 out of 4 consecutive bursts.

(4) The dose variation of each 30 pulse window is calculated and the worse value in each burst is stored. An alarm signal is produced if a single value is greater than 0.6 percent or if the worst values exceed 0.47 percent for 2 out of 3 consecutive bursts or the worst value exceeds 0.4 percent in 3 out of 4 consecutive bursts.

(5) Energy sigma is calculated for each 30 consecutive pulses and the worst value of $3\sigma_E$ is determined for each burst and stored. An alarm signal is produced if a $3\sigma_E$ value for one event is greater than 16 percent or if values of $3\sigma_E$ exceed 13 percent for 2 out of 3 consecutive bursts or if values of $3\sigma_E$ exceed 11 percent for 3 out of 4 consecutive bursts.

(6) Energy variation is calculated for each 30 consecutive pulses. An alarm signal is produced if a single event exceeds 15 percent. No alarm is provided for 2 out of 3 or 3 out of 4 events in this preferred embodiment. The reason is that Applicants' preferred energy control systems purposely varies pulse energy in order to control dose. Therefore, energy variation in these circumstances is not a particularly good measure of beam quality. Dose is a much more important measure.

TABLE I

| Parameter | One Value | 2 Out of 3 Consecutive | 3 Out of 4 Consecutive |
|---|---|---|---|
| $\lambda_v$ | 1.6 pm | 0.13 pm | 0.08 pm |
| $\sigma_\lambda$ | 0.12 pm | 0.95 pm | 0.08 pm |
| $\Delta\lambda$ | 0.73 pm | 0.66 pm | 0.60 pm |
| $\Delta d$ | 0.6% | 0.47% | 0.4% |
| $3\sigma_E$ | 16% | 13% | 11% |
| $E_v$ | 30% | | |

Quality Oversight

In prior art systems, beam quality is monitored primarily by the laser itself and beam quality information is transmitted to the stepper or scanner machine for which the laser provides illumination. FIG. 1 shows the beam quality analysis being done by the laser controller. It could, however, be done by a processor in the stepper device or an external processor. Another approach would be to have the analysis done by a master computer system having an oversight function for a large number of lithography units or all of the lithography units in a fabrication plant. Alternatively, the calculation could be performed at the laser and the results reported to the master computer system. Having this information in one computer system could simplify factory wide quality control and maintenance programs and other processes.

Special Quality Control Considerations

In the semiconductor fabrication industry, there are special circumstances (not normally found in other industries) which makes the present invention especially appropriate. Some of those special circumstances are:

1) Fully automated production and very high cost in lost production due to false alarm down time.
2) The item of commercial interest is a die. Fabricators want to process billions of dies between failures.
3) Systematic variations within a die or from die-to-die may be ten times greater than material random variations.
4) Large numbers measurements (applicable to each die) are utilized.

A typical classical process control can accept false alarms every 500 units. Thus, alarms have been set at about 3 sigma values which provides a low risk of a single bad product. Roughly speaking, 3 sigma is about equal to specifications for production equipment. On the other hand, alarms for semiconductor operations are normally set at about 6 sigma which correlates to one false alarm each billion units. This permits about 1500 hours of operation between false alarms.

The time to respond to an alarm in semiconductor fabrication is roughly equal to the time required to illuminate a single wafer, typically about one minute. Having alarms based on data from two out of three bursts or three out of four burst provides an alarm function substantially shorter than the approximately one minute response time.

The reader should note that although the present invention has been described in the context of laser beam quality parameters affecting integrated circuit fabrication. The principals of this invention could be applied to other aspects of integrated circuit fabrication. Other quality parameters which could affect die quality are:

1) Die-to-die variation in focus and XY stage settle time in a stepper.
2) Die-to-die variation in Z and XY stage settle time in a prober used to test die on a wafer.
3) Die-to-die variation in the voltage calibration signal in a tester.
4) Die-to-die line width variation.
5) Wafer-to-wafer thickness variation in a coater and developer.
6) Wafer-to-wafer thickness variation in a deposition in an etch system.
7) Wafer-to-wafer conductivity variation in a deposition system.
8) Wafer-to-wafer defect count in any semiconductor equipment.

The reader should note that these parameters could be measured for each die or each wafer as appropriate and the principals described above could be used to establish out-of-control alarms of the type described above. In each case a quality parameter must be chosen which provides random variation so basic principal of statistics can be used to set limits in the context of "runs" of bad but not too bad data.

Various modifications may be made to the invention without altering its scope. All of the above are just examples of the present invention. For example, various combinations of the parameters could be used together or separately to trigger an alarm. In some cases tighter quality control could be provided by setting the limits to correspond to one false alarm each 750 hours instead of 1500 hours. Other similar parameters could be substituted. A very obvious example would be to substitute $\sigma_E$ or $2\sigma_E$ for $3\sigma_E$, but with the requirement of a larger number of bad data events. In addition to initiating an alarm if 2 out of 3 successive events exceed mean plus 4 $\sigma$ and 3 out of 4 exceed mean plus 3 $\sigma$, other statistical combinations corresponding to about 6 $\sigma$ could be utilized such as 10 out of 11 consecutive events exceeding a 2 $\sigma$ limit, 14 out of 15 exceeds 1 $\sigma$, 9 out of 10 consecutive events exceeding 2.2 $\sigma$, or 24 out of 25 consecutive events exceeding greater or less than 0. Persons skilled in the art will recognize that there are beam quality parameters, other than the ones specifically described herein, which could be used to monitor beam quality to look for out of control situations. Also, measures other than standard deviations such as variance and root mean square could be used to set limits and examine the data. Those skilled in the art will readily recognize that numerous other modifications and alterations may be made without departing from the spirit and scope of the invention. Accordingly, the above disclosure is not intended to be limiting and the scope of the invention is to be determined by the appended claims.

We claim:

1. A process for determiping when to issue an alarm signal indicating an out-of-control lithography laser having a digital processor, said process comprising the steps of:

A) collecting a quantity of historical beam quality data large enough to provide natural statistical data and based on that data establish alarm criteria based on runs of bad but not too bad data deviating from target values by more than specified values, B) programming said digital processor with an algorithm configured to initiate an alarm notification signal if a run of n out of m beam quality values exceed said specified values;

wherein said specified values are set with an intent to provide a desired very low level of false alarms of no more than one false alarm for each 750 hours of operation.

2. A process as in claim 1 wherein said specified values are set to provide one false alarm approximately each 1500 hours.

3. A process as in claim 2 wherein said beam quality data comprise values of beam quality parameters chosen from a group of parameters consisting of: energy sigma, energy variation, dose variation wavelength sigma, wavelength variation and bandwidth.

4. A process as in claim 3 wherein said specified values are determined by examining a worst beam quality value in each of plurality of consecutive sets of beam quality parameters and then providing said notification signal when the worst value in n sets out of m consecutive sets of beam quality values exceeds a predetermined value.

5. A process as in claim 4 wherein said beam quality data represent worse values of beam quality data in bursts of laser pulses.

6. A process for determining when to issue an alarm signal indicating an out-of-control laser lithography system having a digital processor, said process comprising the steps of:

A) collecting a quantity of historical laser lithography quality data large enough to provide natural statistical data and based on that data establish alarm criteria based on runs of bad but not too bad data deviating from target values by more than specified values, B) programming said digital processor with an algorithm configured to initiate an alarm notification signal if a run of n out of m beam quality values exceed said specified values;

wherein said specified values are set with an intent to provide a desired very low level of false alarms of no more than one false alarm for each 750 hours of operation.

7. A process as in claim 6 wherein said laser lithography quality data comprise values of quality parameters chosen from a group of parameters consisting of: beam variations in: energy sigma, energy variation, dose variation, wavelength sigma, wavelength variation bandwidth; die-to-die variation in: focus, XY settle time, Z and XY settle time, voltage calibration signal, line width; and wafer-to-wafer variations in: thickness of coats and/or developing thickness of deposition, conductivity variations in a deposition system and defect count.

8. An electric discharge laser comprising:

A) two elongated electrodes,

B) a pulse power supply system supplying high voltage electrical pulses to said elongated electrodes to produce electrical discharges between them to create a gain medium, C) an output coupler and a line narrowing means creating a resonance cavity containing said gain medium to produce pulse laser beams, D) a wavemeter arranged to sample portion of pulses of said pulse laser beam in order to monitor beam quality parameters, and E) a processor programmed with software designed to provide notification to an operator informing him when the beam quality is not adequate for integrated circuit fabrication based on runs of statistically significant bad data;

wherein said notification is in the form of a signal and said runs of statistically bad data are determined by examining a worst beam quality value in each of plurality of consecutive sets of beam quality parameters and then providing said notification signal when a worst value in n sets out of m consecutive sets of beam quality values exceeds a predetermined value.

9. A laser as in claim 8 wherein each consecutive set defines a number of beam quality data and said number is chosen to assure to substantially random natural variation of worst beam quality values.

10. A laser as in claim 9 wherein said number of beam quality data is equal to a number of beam quality measurements in bursts of pulses.

11. A laser as in claim 8 wherein n is 2 and m is 3.

12. A laser as in claim 8 herein n is 3 and m is 4.

13. A laser as in claim 8 wherein said notification signal is provided when n is 2 and m is 3 for a first predetermined value or if n is 3 and m is 4 for a second predetermined value.

14. An electric discharge laser comprising:

A) two elongated electrodes,

B) a pulse power supply system supplying high voltage electrical pulses to said elongated electrodes to produce electrical discharges between them to create a gain medium, C) an output coupler and a line narrowing means creating a resonance cavity containing said gain medium to produce pulse laser beams, D) a wavemeter arranged to sample portion of pulses of said pulse laser beam in order to monitor beam quality parameters, and E) a processor programmed with software designed to provide notification to an operator informing him when the beam quality is not adequate for integrated circuit fabrication based on runs of statistically significant bad data;

wherein said criteria for designating data as statistically significant bad data is based on data deviating from a target value by more than a predetermined value, and wherein said predetermined value is chosen utilizing a quantity of beam quality data sufficiently large to define natural statistical variations in the data.

15. A laser as in claim 14 wherein said predetermined value is chosen to assure an average of no more than one false alarm in about 1500 hours of operation.

16. An electric discharge laser comprising:

A) two elongated electrodes,

B) a pulse power supply system supplying high voltage electrical pulses to said elongated electrodes to produce electrical discharges between them to create a gain medium, C) an output coupler and a line narrowing means creating a resonance cavity containing said gain medium to produce pulse laser beams, D) a wavemeter arranged to sample portion of pulses of said pulse laser beam in order to monitor beam quality parameters, and E) a processor programmed with software designed to provide a notification signal to an operator informing him when the beam quality is not adequate for integrated circuit fabrication based on runs of beam quality data deviating from target values by a predetermined range corresponding to more than one standard deviation and less than six standard deviations;

wherein said range is determined by examining a quantity of beam quality data large enough to provide natural statistical variations in the data.

17. A laser as in claim 16 wherein said beam quality data comprise values of beam quality parameters chosen from a group of parameters consisting of: energy sigma, energy variation, dose variation, wavelength sigma, wavelength variation and bandwidth.

18. A laser as in claim 16 wherein runs of beam quality data is determined by examining a worst beam quality value in each of plurality of consecutive sets of beam quality parameters and then providing said notification signal when the worst value in n sets out of m consecutive sets of beam quality values exceeds a predetermined value.

* * * * *